US011515847B2

(12) United States Patent
Holmes et al.

(10) Patent No.: US 11,515,847 B2
(45) Date of Patent: Nov. 29, 2022

(54) POWER AMPLIFIERS AND UNMATCHED POWER AMPLIFIER DEVICES WITH LOW BASEBAND IMPEDANCE TERMINATIONS

(71) Applicant: NXP USA, Inc., Austin, TX (US)

(72) Inventors: Damon G. Holmes, Scottsdale, AZ (US); Ning Zhu, Chandler, AZ (US); Jeffrey Spencer Roberts, Tempe, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 325 days.

(21) Appl. No.: 17/023,132

(22) Filed: Sep. 16, 2020

(65) Prior Publication Data

US 2022/0085772 A1 Mar. 17, 2022

(51) Int. Cl.
*H03F 3/195* (2006.01)
*H03F 3/24* (2006.01)
*H03F 1/56* (2006.01)
*H03F 1/02* (2006.01)
*H01L 23/66* (2006.01)

(52) U.S. Cl.
CPC ............ *H03F 3/195* (2013.01); *H01L 23/66* (2013.01); *H03F 1/0288* (2013.01); *H03F 1/565* (2013.01); *H03F 3/245* (2013.01); *H01L 2223/6611* (2013.01); *H01L 2223/6655* (2013.01); *H03F 2200/267* (2013.01); *H03F 2200/318* (2013.01); *H03F 2200/451* (2013.01)

(58) Field of Classification Search
CPC ...................................................... H03F 3/195
See application file for complete search history.

(56) References Cited

U.S. PATENT DOCUMENTS

| 8,659,359 | B2 | 2/2014 | Ladhani et al. |
| 9,692,363 | B2 | 6/2017 | Zhu et al. |
| 10,199,991 | B2 | 2/2019 | Ladhani et al. |
| 10,541,653 | B2 | 1/2020 | Zhu et al. |
| 10,742,178 | B2 | 8/2020 | Zhu et al. |
| 2007/0273449 | A1 | 11/2007 | Wilson |
| 2008/0231373 | A1 | 9/2008 | Rahman et al. |
| 2019/0173435 | A1* | 6/2019 | McLaren ............... H03F 3/60 |
| 2020/0204119 | A1* | 6/2020 | Roberts .............. H03F 3/195 |
| 2021/0175860 | A1* | 6/2021 | Roberts .............. H03F 1/0288 |
| 2021/0202408 | A1* | 7/2021 | Khalil .................. H03F 3/195 |

* cited by examiner

*Primary Examiner* — Patricia T Nguyen
(74) *Attorney, Agent, or Firm* — Sherry W Gourlay

(57) ABSTRACT

A packaged RF amplifier device includes input and output leads and a transistor die. The transistor die includes a transistor with a drain-source capacitance below 0.1 picofarads per watt. The device also includes a conductive connection between the transistor output terminal and the output lead, and a baseband termination circuit between the transistor output terminal and a ground reference node. The baseband termination circuit presents a low impedance to signal energy at envelope frequencies and a high impedance to signal energy at RF frequencies. The baseband termination circuit includes an inductive element, a resistor, and a capacitor connected in series between the transistor output terminal and the ground reference node. Except for a minimal impedance transformation associated with the conductive connection, the device is unmatched between the transistor output terminal and the output lead by being devoid of impedance matching circuitry between the transistor output terminal and the output lead.

20 Claims, 6 Drawing Sheets

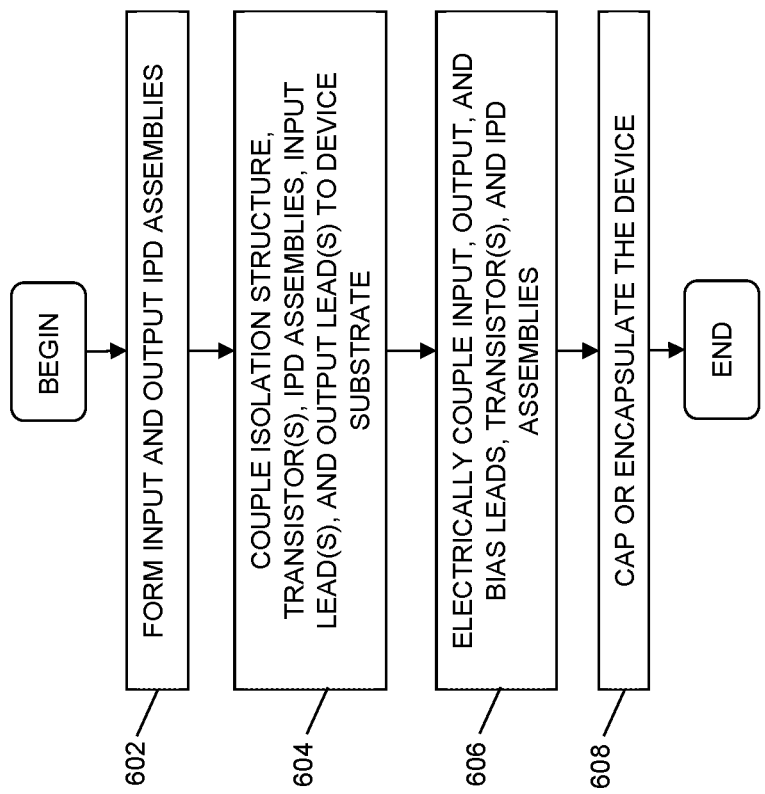

POWER AMPLIFIERS AND UNMATCHED POWER AMPLIFIER DEVICES WITH LOW BASEBAND IMPEDANCE TERMINATIONS

TECHNICAL FIELD

Embodiments of the subject matter described herein relate generally to radio frequency (RF) amplifiers, and more particularly to power amplifiers and power amplifier devices, and methods of manufacturing such amplifiers and devices.

BACKGROUND

Wireless communication systems employ power amplifiers for increasing the power of radio frequency (RF) signals. In a cellular base station, for example, a power amplifier typically forms a portion of the last amplification stage in a transmission chain before provision of the amplified signal to an antenna for radiation over the air interface. High gain, high linearity, wide signal bandwidth, stability, and a high level of power-added efficiency are characteristics of a desirable power amplifier in such a wireless communication system.

For various reasons, developers of some modern base station transmitters desire power amplifier devices that are unmatched at their outputs, meaning that the power amplifier devices lack in-package RF output impedance matching circuitry. Unfortunately, however, power amplifier devices that lack in-package RF output impedance matching circuitry are typically characterized by relatively-narrow signal bandwidths (e.g., bandwidths of only about 200 megahertz (MHz) or less) due to the resonance of printed circuit board bias line inductance with the capacitance of the device, package, and other printed circuit board RF matching components. Accordingly, what are needed are unmatched power amplifier devices that are characterized by improved baseband frequency responses and increased signal bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 6 is a flowchart of a method for fabricating a packaged RF power amplifier device that includes an embodiment of a baseband termination circuit, in accordance with an example embodiment.

DETAILED DESCRIPTION

Figure 1:
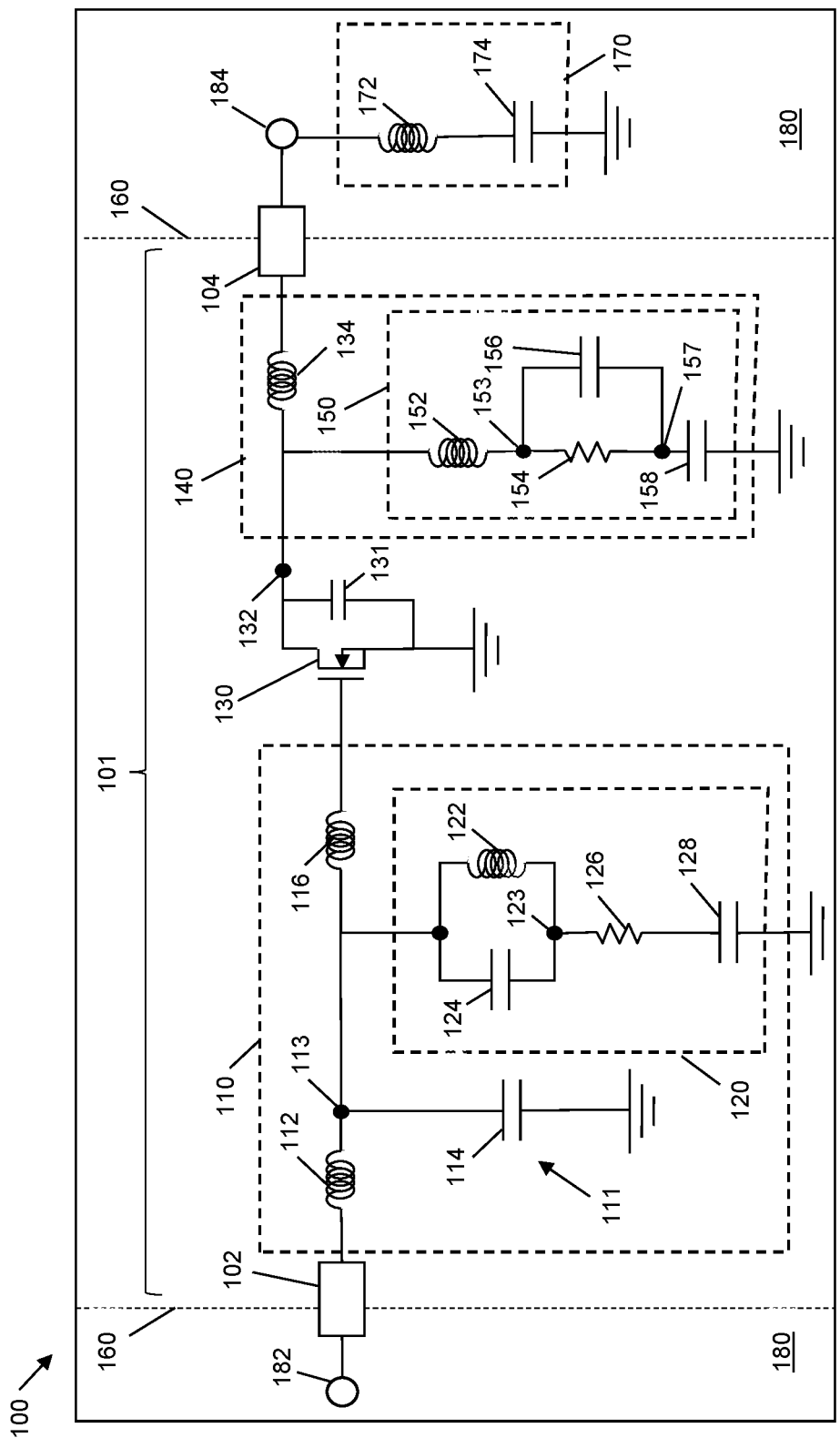
FIG. 1 is a schematic circuit diagram of a power amplifier circuit, in accordance with an example embodiment.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification.

One challenge arises from the significant difference in output capacitance between LDMOS and GaN power amplifier devices. For example, when compared with a silicon-based LDMOS transistor, the drain-source capacitance, Cds, of a GaN-based transistor is relatively low on a per RF output peak power basis. For example, whereas an LDMOS transistor may have a drain-source capacitance greater than about 0.3 picofarads per watt (pF/W), a GaN-based transistor may have a drain-source capacitance less than about 0.1 pF/W. If a GaN-based transistor were used in a conventional power amplifier device, an output impedance matching circuit with a relatively high shunt inductance should be implemented in order to provide adequate matching.

However, as mentioned above, some base station developers may desire power amplifier devices that are unmatched at their outputs (i.e., the power amplifier devices lack in-package RF output impedance matching circuitry). One reason for this desire is that an unmatched device may better enable the developer to design a custom harmonic termination at the printed circuit board (PCB) assembly level. Second harmonic terminations play an important role in the overall performance of a power amplifier design that uses a GaN-based transistor because peak power capability and power added efficiency are known to be strong functions of second harmonic termination. An adequately-designed, PCB-level second harmonic termination circuit, which is enabled with the use of an unmatched device, may overcome this issue. As also mentioned above, however, power amplifier devices that lack in-package RF output impedance matching circuitry are typically characterized by relatively-narrow signal bandwidths due to the resonance of PCB bias line inductance with the capacitance of the device, package, and other PCB RF matching components.

To enable increased signal bandwidths and otherwise improved amplifier performance, embodiments of unmatched power amplifier devices are described herein, which include in-package baseband termination circuitry at the amplifier output. As used herein, the term "unmatched", as it relates to a power amplifier device, means that, except for a minimal impedance transformation associated with a conductive connection (e.g., wirebonds 334, FIGS. 3, 4) between the output terminal of the device's transistor (e.g., output terminal 332, FIGS. 3, 4) and the output lead (e.g., output lead 305, FIGS. 3, 4), the power amplifier device is devoid of (i.e., lacks) impedance matching circuitry between the output terminal and the output lead.

These power amplifier devices may be characterized by improved baseband frequency responses and increased signal bandwidth, when compared with conventional power amplifier devices, while also enabling a developer to design custom harmonic terminations at the PCB assembly level.

As will be described in detail below, some specific embodiments of the inventive subject matter include power amplifier devices with in-package baseband termination circuitry that includes an inductance, a resistance, and a high-value capacitance that are series-coupled between the transistor output and a ground reference. The baseband circuitry allows for a baseband impedance, presented at the output terminal of the transistor, that may be nearly ten times smaller in magnitude compared with conventional unmatched power amplifier devices. At RF frequencies, the baseband circuitry presents a large impedance to the RF path, effectively isolating the circuit at RF frequencies.

FIG. 1 is a schematic diagram of an RF power amplifier circuit 100. Circuit 100 includes a power amplifier device 101 (e.g., device 300, FIG. 3) with a plurality of components and circuitry that are connected to or contained within a power amplifier device package (i.e., the components and circuitry are "in-package" or at the "device plane"). More specifically, the power amplifier device 101 is a discretely packaged circuit that includes an input 102 (e.g., a first conductive package lead), an input circuit 110, a power transistor 130, an output circuit 140, and an output lead 104 (e.g., a second conductive package lead), in an embodiment. When incorporated into an amplifier system, the power amplifier device 101 may be mounted to a PCB 180 (or other type of system substrate), and in FIG. 1, the transitions at the input 102 and output 104 of the device 101 between the "PCB plane" (i.e., the portion of the amplifier 100 that is connected to the PCB 180 and outside of the interior of device 101) and the "device plane" (i.e., the portion of the amplifier 100 that is housed within the power amplifier device 101) are indicated with vertical dashed lines 160.

Figure 3:
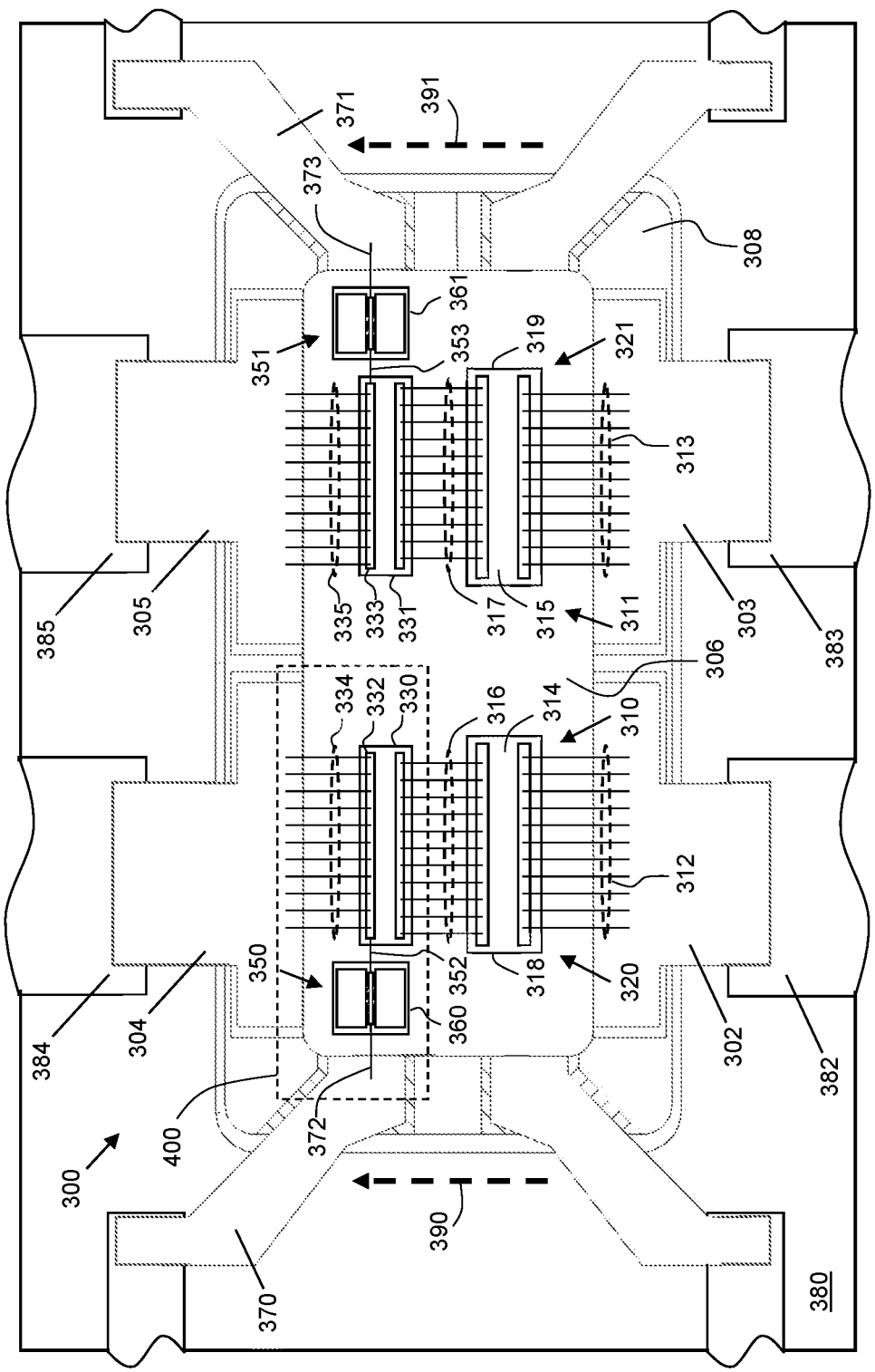
FIG. 3 is a top view of a packaged RF power amplifier device that includes two parallel amplification paths, in accordance with an example embodiment.

Input 102 and output 104 each may include a conductor, which is configured to enable the device 101 to be mechanically and electrically coupled with external circuitry, including conductive input and output connectors 182, 184, respectively, on the PCB 180 (e.g., input and output connectors 382, 384, FIG. 3). More specifically, the input and output 102, 104 are physically positioned to span between the exterior and the interior of the device package, or to provide an electrical transition between the package plane and the device plane. Input circuit 110 is electrically coupled between the input 102 and a first terminal of transistor 130 (e.g., the gate terminal), and output circuit 140 is electrically coupled between a second terminal of transistor 130 (e.g., the drain terminal) and the output 104.

According to an embodiment, transistor 130 is the primary active component of circuit 100. Transistor 130 includes a control terminal and two current conducting terminals, where the current conducting terminals are spatially and electrically separated by a variable-conductivity channel. For example, transistor 130 may be a field effect transistor (FET), which includes a gate (control terminal), a drain (a first current conducting terminal), and a source (a second current conducting terminal). According to an embodiment, and using nomenclature typically applied to FETs in a non-limiting manner, the gate of transistor 130 is coupled to the input circuit 110, the drain of transistor 130 is coupled to the output circuit 140, and the source of transistor 130 is coupled to ground (or another voltage reference). Through the variation of control signals provided to the gate of transistor 130, the current between the current conducting terminals of transistor 130 may be modulated.

According to various embodiments, transistor 130 is a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 130 is represented with capacitor 131 between the drain of transistor 130 and a transistor output terminal 132 (e.g., corresponding to transistor output terminal 332, FIGS. 3, 4). More specifically, capacitor 131 is not a physical component, but instead models the drain-source capacitance of transistor 130. According to an embodiment, transistor 130 may have a drain-source capacitance that is less than about 0.1 pF/W. Further, in some embodiments, transistor 130 may be a GaN FET, although in other embodiments, transistor 130 may be another type of III-V transistor (e.g., gallium arsenide (GaAs), gallium phosphide (GaP), indium phosphide (InP), or indium antimonide (InSb)), or another type of transistor that has a relatively low drain-source capacitance.

The input circuit 110 includes an input impedance matching circuit 111 and a first baseband termination circuit 120. The input impedance matching circuit 111 is coupled between the input 102 and the control terminal (e.g., gate) of the transistor 130. Input impedance matching circuit 111 is configured to raise the impedance of circuit 100 to a higher (e.g., intermediate or higher) impedance level (e.g., in a range from about 2 to about 10 Ohms or higher). This is advantageous in that it allows the PCB-level matching interface from a driver stage (not shown) to have an impedance that can be achieved in high-volume manufacturing with minimal loss and variation (e.g., a "user friendly" matching interface).

According to an embodiment, input impedance matching circuit 111 includes two inductive elements 112, 116 (e.g., two sets of bondwires) and a shunt capacitance 114. A first inductive element 112 (e.g., a first set of bondwires) is coupled between input 102 and intermediate node 113, which is in turn coupled to a first terminal of capacitor 114. A second inductive element 116 (e.g., a second set of bondwires) is coupled between the intermediate node 113 (and the first terminal of capacitor 114) and the control terminal of transistor 130. The second terminal of capacitor 114 is coupled to a ground reference node (or another voltage reference). For example, shunt capacitance 114 may include one or more capacitors that are integrally formed as a portion of an IPD, such as IPD 314 or 315, FIG. 3. The combination of inductive elements 112, 116 and shunt capacitance 114 functions as a low-pass filter. According to an embodiment, the series combination of inductive elements 112, 116 may have an inductance value in a range between about 50 picohenries (pH) to about 3 nanohenries (nH), and shunt capacitance 114 may have a capacitance value in a range between about 5 picofarads (pF) to about 120 pF.

The first baseband termination circuit 120 is coupled between intermediate node 113 and the ground reference node. The first baseband termination circuit 120 may function to improve the low frequency resonance (LFR) of circuit 100 caused by the interaction between the input impedance matching circuit 111 and the bias feeds (not shown) by presenting a low impedance to signal energy at envelope frequencies (i.e., baseband frequencies) and/or a high impedance to signal energy at RF frequencies. Essentially, the first baseband termination circuit 120 functions as a low pass filter with a cutoff frequency that is significantly below the operational band of amplifier 100. For example, whereas the operational band of amplifier 100 may be in the megahertz to gigahertz range, the cutoff frequency of the first baseband termination circuit may be in a range of about 500 megahertz (MHz) to about 1000 MHz, in an embodiment. The cutoff frequency may be lower or higher, as well.

As used herein, signal energy at "envelope frequencies" means signal energy between 0 hertz and about 500 MHz, and signal energy at "RF frequencies" means signal energy at frequencies above about 500 MHz, or signal energy between about 500 MHz and about 300 gigahertz (GHz) (e.g., between about 500 MHz and about 10 GHz, in some embodiments, or between about 10 GHz and about 100 GHz, in other embodiments). The first baseband termination circuit 120 essentially may be considered to be "invisible" from an RF matching standpoint, as it primarily effects the impedance at envelope frequencies (i.e., baseband termination circuit 120 provides terminations for the envelope frequencies of circuit 100). The first baseband termination circuit 120 may have any of a number of different circuit configurations, in various embodiments.

In the embodiment illustrated in FIG. 1, the first baseband termination circuit 120 includes an envelope inductance 122, $L_{env}$, an envelope resistor 126, $R_{env}$, and an envelope capacitor 128, $C_{env}$, coupled in series between intermediate node 113 and the ground reference node. More specifically, a first terminal of envelope inductance 122 is coupled to node 113, and a second terminal of envelope inductance 122 is coupled to node 123. A first terminal of envelope resistor 126 is coupled to node 123, and a second terminal of envelope resistor 126 is coupled to a first terminal of envelope capacitor 128. A second terminal of the envelope capacitor 128 is coupled to the ground reference node. Although the order of the series of components between node 113 and the ground reference node is the envelope inductance 122, the envelope resistor 126, and the envelope capacitor 128 in FIG. 1, the order of components in the series circuit could be different, in other embodiments.

The envelope inductance 122, may be implemented as an integrated inductance, as a discrete inductor, and/or as a set of bondwires coupling the node 113 to the envelope resistor 126 (e.g., via node 123). For example, envelope inductance 122 may include one or more inductors that are integrally formed portion(s) of an integrated passive device (IPD), such as IPD 314 or 315, FIG. 3. For example, envelope inductance 122 may have an inductance value in a range between about 5 picohenries (pH) to about 2000 pH. Desirably, envelope inductance 122 has an inductance value less than about 500 pH (e.g., as low as 50 pH, in an embodiment, or possibly even lower). In other embodiments, the value of envelope inductance 122 may be lower or higher than the above-given range.

Envelope resistor 126 may be implemented as an integrated resistor or as a discrete resistor, in various embodiments. For example, envelope resistor 126 may include one or more resistors that are integrally formed portion(s) of an IPD, such as IPD 314 or 315, FIG. 3. In an embodiment, envelope resistor 126 may have a resistance value in a range between about 0.1 ohm to about 5.0 ohm, although envelope resistor 126 may have a resistance value outside of this range, as well.

Envelope capacitor 128 may be implemented as an integrated capacitor or as a discrete capacitor (e.g., a "chip capacitor"), in various embodiments. For example, envelope capacitor 128 may include one or more capacitors that are integrally formed as portion(s) of an IPD, such as IPD 314 or 315, FIG. 3. In an embodiment, envelope capacitor 128 may have a capacitance value in a range between about 1 nanofarad (nF) to about 1 microfarad (µF), although envelope capacitor 128 may have a capacitance value outside of this range, as well.

In addition to the above-described components, the first baseband termination circuit 120 also includes one or more "bypass" or "parallel" capacitors 124, $C_{para}$, which is coupled in parallel with the envelope inductance 122. More specifically, first terminals of envelope inductance 122 and bypass capacitor 124 are coupled to node 113, and second terminals of envelope inductance 122 and bypass capacitor 124 are coupled to node 123. In alternate embodiments, the bypass capacitor(s) 124 may be coupled in parallel with the envelope resistor 126 or with the series combination of the envelope inductance 122 and the envelope resistor 126. The bypass capacitor 124 may be implemented as a discrete capacitor, in some embodiments, or as an integrated capacitor, in other embodiments. The bypass capacitor 124 may have a capacitance value in a range between about 3.0 pF to about 1300 pF. In other embodiments, the value of bypass capacitor 124 may be lower or higher than the above-given range. In still other embodiments, the bypass capacitor 124 may be excluded from circuit 120.

Parallel-coupled inductance 122 and capacitor 124 form a parallel resonant circuit at frequencies in proximity to the center operational frequency of the device or circuit (e.g., circuit 100). As used herein, and according to an embodiment, the term "in proximity to the center operating frequency" means "within 20 percent of the center operating frequency." Accordingly, for example, when a device has a center operating frequency of 2.0 GHz, a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 113 to which circuit 120 is coupled will be deflected by the parallel resonant circuit $L_{env}//C_{para}$. This deflection may be provided even using a relatively low inductance value for inductance 122. For this reason, circuit 120 may significantly improve the LFR of a device or circuit (e.g., circuit 100) in which it is incorporated by presenting a low impedance at envelope frequencies and a high impedance at RF frequencies.

As will be described in more detail later in conjunction with FIG. 3, various embodiments of RF amplifier devices may include at least one input-side IPD assembly (e.g., IPD assemblies 318, 319, FIG. 3), which includes portions of the input circuit 110. More specifically, each IPD assembly may include a semiconductor substrate with one or more integrated passive components. In a particular embodiment, each input-side IPD assembly may include shunt capacitance 114, envelope inductance 122, bypass capacitor 124, envelope resistor 126, and envelope capacitor 128. In other embodiments, some or all of these portions of the input circuit 110 may be implemented as distinct/discrete components or as portions of other types of assemblies (e.g., a low-temperature co-fired ceramic (LTCC) device, a small PCB assembly, and so on). In still other embodiments, some or all of these portions of the input circuit 110 may be coupled to and/or integrated within the semiconductor die that includes transistor 130. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

On the output side of transistor 130, output circuit 140 is coupled between the first current conducting terminal (e.g., drain) of transistor 130 and the output 104. Output circuit 140 specifically lacks an output impedance matching circuit within the device 101 (i.e., on the device plane). In other words, device 101 is "unmatched" at its output, and any output matching (not illustrated) may be coupled, instead, to the output connector 184 on the PCB 180.

According to an embodiment, output circuit 140 includes a conductive connection 134 and a second baseband termination circuit 150. Conductive connection 134 (e.g., a third set of bondwires) is coupled between the first current conducting terminal 132 (e.g., drain) of transistor 130 and the output 104, and functions to convey the RF signal that is amplified by transistor 130 to the output 104. According to an embodiment, the conductive connection 134 may be inductive, in nature, and may have an inductance value in a range between about 10 pH to about 1000 pH, although conductive connection 134 may have an impedance value outside of this range, as well. Desirably, the inductance value of conductive connection 134 is below about 500 pH. Depending on the impedance value of the conductive connection 134, connection 134 may result in a minimal impedance transformation at RF frequencies, but the conductive connection 134 is not considered to be an impedance matching circuit.

According to an embodiment, the second baseband termination circuit 150 is coupled between the first current conducting terminal 132 of transistor 130 and the ground reference node. Similar to the first baseband termination circuit 120 on the input side, the second baseband termination circuit 150 may function to improve the LFR of circuit 100 caused by the interaction between the output circuit 140 and the bias feeds (not shown) by presenting a low impedance to signal energy at envelope frequencies (i.e., baseband frequencies) and/or a high impedance to signal energy at RF frequencies. Essentially, the second baseband termination circuit 150 functions as a low pass filter with a cutoff frequency that is significantly below the operational band of amplifier 100. For example, whereas the operational band of amplifier 100 may be in the megahertz to gigahertz range, the cutoff frequency of the second baseband termination circuit may be in a range of about 500 MHz to about 1000 MHz, in an embodiment. The cutoff frequency may be lower or higher, as well. Again, baseband termination circuit 150 essentially may be considered to be "invisible" from an RF matching standpoint, as it primarily effects the impedance at envelope frequencies (i.e., baseband termination circuit 150 provides terminations for the envelope frequencies of circuit 100). The baseband termination circuit 150 may have any of a number of different circuit configurations, in various embodiments.

In the embodiment illustrated in FIG. 1, the second baseband termination circuit 150 includes an envelope inductance 152, $L_{env}$, an envelope resistor 154, $R_{env}$, and an envelope capacitor 158, $C_{env}$, coupled in series between intermediate node 113 and the ground reference node. More specifically, a first terminal of envelope inductance 152 is coupled to transistor terminal 132, and a second terminal of envelope inductance 152 is coupled to node 153. A first terminal of envelope resistor 154 is coupled to node 153, and a second terminal of envelope resistor 154 is coupled to node 157. A first terminal of envelope capacitor 158 also is coupled to node 157, and a second terminal of the envelope capacitor 158 is coupled to the ground reference node. Although the order of the series of components between terminal 132 and the ground reference node is the envelope inductance 152, the envelope resistor 154, and the envelope capacitor 158 in FIG. 1, the order of components in the series circuit could be different, in other embodiments.

The envelope inductance 152 is implemented as a set of one or more bondwires (e.g., bondwire 152, FIGS. 3, 4) coupling terminal 132 to the envelope resistor 154, according to an embodiment. For example, envelope inductance 152 may have an inductance value in a range between about 500 pH to about 2.0 nanohenries (nH). In other embodiments, the value of envelope inductance 152 may be lower or higher than the above-given range. Desirably, envelope inductance 152 is a very high valued inductance (e.g., an inductance greater than about 1.0 nH), which functions to block substantially all RF signal energy. It should be noted that envelope inductance 152 is not an RF impedance matching component.

Envelope resistor 154 may be implemented as one or more integrated resistors or as one or more discrete resistors, in various embodiments. For example, envelope resistor 154 may include one or more resistors (e.g., resistors 454, FIG. 4) that are integrally formed as portion(s) of an IPD, such as IPD 360 or 361, FIG. 3. In an embodiment, envelope resistor 154 may have a resistance value in a range between about 0.1 ohm to about 5.0 ohm, although envelope resistor 154 may have a resistance value outside of this range, as well.

Envelope capacitor 158 may be implemented as one or more integrated capacitors or as one or more discrete capacitors (e.g., a "chip capacitors"), in various embodiments. For example, envelope capacitor 158 may include one or more capacitors (e.g., capacitors 458, FIG. 4) that are integrally formed as portion(s) of an IPD, such as IPD 360 or 361, FIG. 3. In an embodiment, envelope capacitor 158 may have a capacitance value in a range between about 1 nF to about 1 µF, although envelope capacitor 158 may have a capacitance value outside of this range, as well.

In addition to the above-described components, the second baseband termination circuit 150 also may include one or more "bypass" or "parallel" capacitors 156, $C_{para}$, which is coupled in parallel with the envelope resistor 154. More specifically, first terminals of envelope resistor 154 and the bypass capacitor 156 are coupled to node 153, and second terminals of envelope resistor 154 and the bypass capacitor 156 are coupled to node 157. The bypass capacitor 156 may be implemented as one or more discrete capacitors, in some embodiments, or as one or more integrated capacitors, in other embodiments. For example, bypass capacitor 156 may include one or more capacitors that are coupled to or integrally formed as portion(s) of an IPD, such as IPD 360 or 361, FIG. 3. The bypass capacitor 156 may have a capacitance value in a range between about 3.0 pF to about 1300 pF. In other embodiments, the value of bypass capacitor 156 may be lower or higher than the above-given range. In still other embodiments, the bypass capacitor 156 may be excluded from circuit 150.

Because capacitor 156 may function to route RF current around the envelope resistor 154, bypass capacitor 156 may result in a reduction in the RF current dissipated by the envelope resistor 154. This characteristic of circuit 150 also may serve to better protect the envelope resistor 154 from potential compromise due to excessive current that may otherwise flow through the envelope resistor 154 in the absence of bypass capacitor 156.

As will be described in more detail later in conjunction with FIG. 3, various embodiments of RF amplifier devices may include at least one output-side IPD assembly (e.g., IPD assemblies 360, 361, FIG. 3), which includes portions of the output circuit 140, and more specifically, portions of baseband termination circuit 150. Again, each IPD assembly may include a semiconductor substrate with one or more integrated passive components. In a particular embodiment, each output-side IPD assembly may include envelope resistor 154, envelope capacitor 158, and bypass capacitor 156 (when included). In other embodiments, some or all of these portions of the baseband termination circuit 150 may be implemented as distinct/discrete components or as portions of other types of assemblies (e.g., an LTCC device, a small PCB assembly, and so on). In still other embodiments, some or all of these portions of the output circuit 150 may be coupled to and/or integrated within the semiconductor die that includes transistor 130.

As indicated previously, because device 101 is unmatched at its output (i.e., device 101 lacks (or is devoid of) in-package RF output impedance matching circuitry), it may be desirable to couple a harmonic termination circuit 170 to the PCB 180 (or to another type of system substrate to which device 101 is coupled) between device output 104 and an output node 184 (e.g., a conductive node or trace that is also coupled to an antenna or other output device). According to an embodiment, the external harmonic termination circuit 170 enables circuit 100 to be accurately tuned to achieve relatively high fractional bandwidth with good performance.

According to an embodiment, harmonic termination circuit 170 is a second harmonic termination circuit, which is coupled between the device output 104 and ground (or another voltage reference). Harmonic termination circuit 170 includes inductive element 172 and capacitance 174 coupled in series between the output 104 of device 101 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 172 may have an inductance value in a range between about 20 pH to about 2 nH, and capacitance 174 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 172 may have an inductance value of about 140 pH, and capacitance 174 may have a capacitance value of about 11 pF.

During operation of an embodiment of a device, the harmonic termination circuit 170 is essentially equivalent to a capacitor at a fundamental frequency of operation of the circuit 100, with the capacitance value being approximately equivalent to the effective capacitance of the series-coupled inductance and capacitance (e.g., inductor 172 and capacitor 174, FIG. 1) of the harmonic termination circuit 170. In addition, the harmonic termination circuitry 170 may be used to control the second harmonic impedance across a wide (e.g., 20 percent plus) fractional bandwidth at relatively low impedance (e.g., close to short circuit). This may be useful in achieving relatively high efficiency for broadband applications.

Although transistor 130 and various elements of the input and output circuits 110, 140, are shown as singular components in FIG. 1, the depiction is for the purpose of ease of explanation only. Those of skill in the art would understand, based on the description herein, that transistor 130 and/or certain elements of the input and output circuits 110, 140 each may be implemented as multiple components (e.g., connected in parallel or in series with each other). Further, embodiments may include single-path amplifier devices (e.g., including a single input lead, output lead, transistor, etc.), dual-path amplifier devices (e.g., including two input leads, output leads, transistors, etc.), and/or multi-path amplifier devices (e.g., including two or more input leads, output leads, transistors, etc.). Further, the number of input/output leads may not be the same as the number of transistors (e.g., there may be multiple transistors operating in parallel for a given set of input/output leads). The description of transistor 130 and various elements of the input and output circuits 110, 140, above, thus are not intended to limit the scope of the inventive subject matter only to the illustrated embodiments.

As indicated above, the RF amplifier circuit 100 of FIG. 1 may be utilized as a single-path amplifier, which receives an RF signal at input 102, amplifies the signal through transistor 130, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 2:
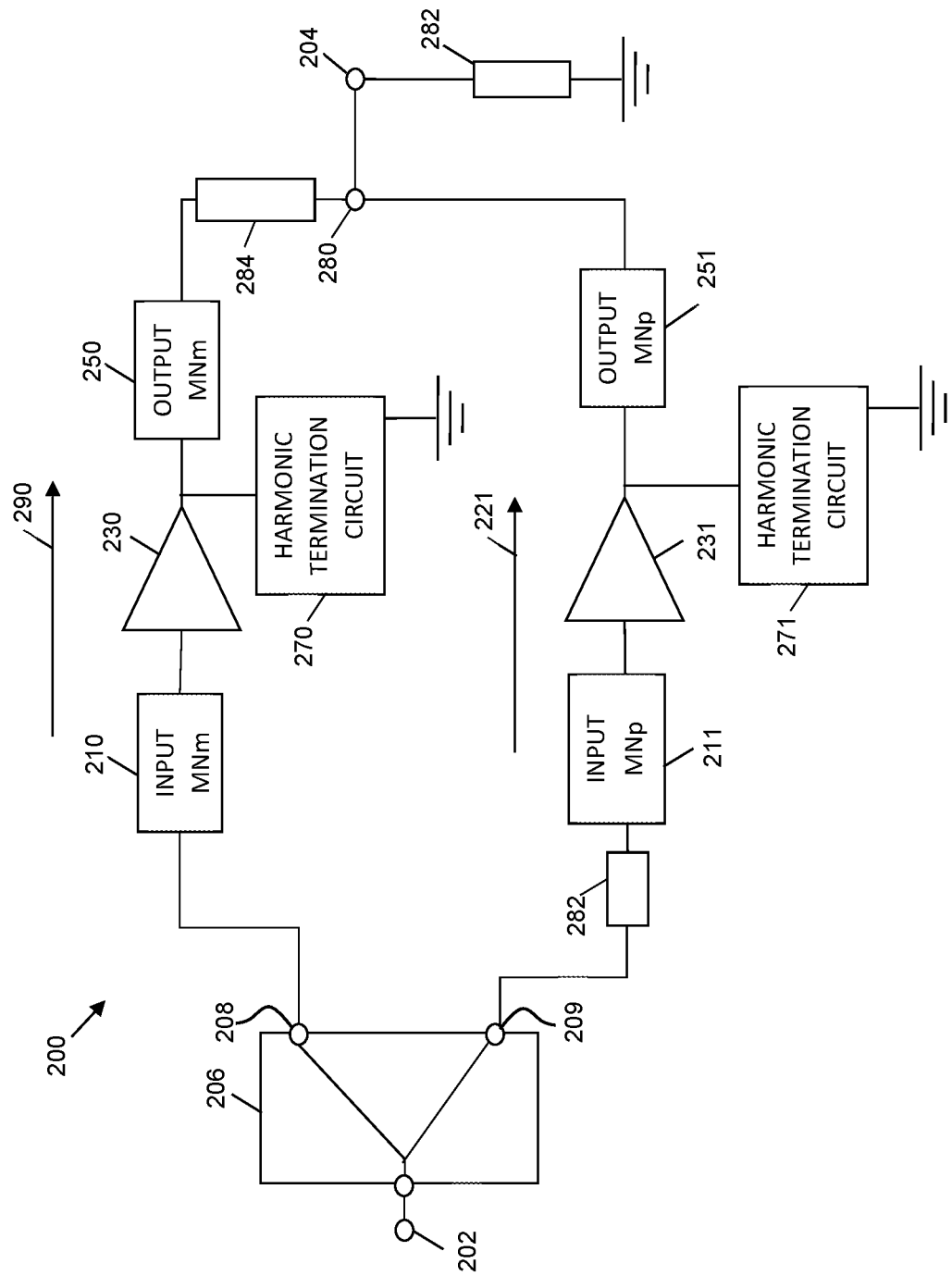
FIG. 2 is a simplified schematic diagram of a Doherty power amplifier, in accordance with an example embodiment.

For example, FIG. 2 is a simplified schematic diagram of a Doherty power amplifier 200 in which embodiments of RF power amplifier circuit 100 may be implemented. Amplifier 200 includes an input node 202, an output node 204, a power divider 206 (or splitter), a main amplifier path 290, a peaking amplifier path 291, and a combining node 280. A load 282 may be coupled to the combining node 280 (e.g., through an impedance transformer, not shown) to receive an amplified RF signal from amplifier 200.

Power divider 206 is configured to divide the power of an input RF signal received at input node 202 into main and peaking portions of the input signal. The main input signal is provided to the main amplifier path 290 at power divider output 208, and the peaking input signal is provided to the peaking amplifier path 291 at power divider output 209. During operation in a full-power mode when both the main and peaking amplifiers 230, 231 are supplying current to the load 282, the power divider 206 divides the input signal power between the amplifier paths 290, 291. For example, the power divider 206 may divide the power equally, such that roughly one half of the input signal power is provided to each path 290, 291 (e.g., for a symmetric Doherty amplifier configuration). Alternatively, the power divider 206 may divide the power unequally (e.g., for an asymmetric Doherty amplifier configuration).

Essentially, the power divider 206 divides an input RF signal supplied at the input node 202, and the divided signals are separately amplified along the main and peaking amplifier paths 290, 291. The amplified signals are then combined in phase at the combining node 280. It is important that phase coherency between the main and peaking amplifier paths 290, 291 is maintained across a frequency band of interest to ensure that the amplified main and peaking signals arrive in phase at the combining node 280, and thus to ensure proper Doherty amplifier operation.

Each of the main amplifier 230 and the peaking amplifier 231 includes a power transistor device (e.g., device 101, FIG. 1) for amplifying an RF signal conducted through the amplifier 230, 231. According to various embodiments, at least a final amplifier stage of either or both the main amplifier 230 and/or the peaking amplifier 231 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 230 or the peaking amplifier 231 is implemented as a III-V FET, the other amplifier may be implemented as a silicon-based FET (e.g., an LDMOS FET), in some embodiments. Further, where each of amplifiers 230, 231 includes a two-stage amplifier with a pre-amplifier driving a final stage amplifier, the pre-amplifier may be implemented as a III-V FET or as a silicon based FET (e.g., a GaN pre-amplifier FET may drive a GaN final-stage FET, or an LDMOS pre-amplifier FET may drive a GaN final-stage FET).

Although the main and peaking FETs may be of equal size (e.g., in a symmetric Doherty configuration), the main and peaking FETs may have unequal sizes, as well (e.g., in various asymmetric Doherty configurations). In an asymmetric Doherty configuration, the peaking FET(s) typically are larger than the main FET(s) by some multiplier. For example, the peaking FET(s) may be twice the size of the main FET(s) so that the peaking FET(s) have twice the current carrying capability of the main FET(s). Peaking-to-main FET size ratios other than a 2:1 ratio may be implemented, as well.

During operation of Doherty amplifier 200, the main amplifier 230 is biased to operate in class AB mode, and the peaking amplifier 231 is biased to operate in class C mode. At low power levels, where the power of the input signal at node 202 is lower than the turn-on threshold level of peaking amplifier 231, the amplifier 200 operates in a low-power (or back-off) mode in which the main amplifier 230 is the only amplifier supplying current to the load 282. When the power of the input signal exceeds a threshold level of the peaking amplifier 231, the amplifier 200 operates in a high-power mode in which the main amplifier 230 and the peaking amplifier 231 both supply current to the load 282. At this point, the peaking amplifier 231 provides active load modulation at combining node 280, allowing the current of the main amplifier 230 to continue to increase linearly.

Input and output impedance matching networks 210, 250 (input MNm, output MNm) may be implemented at the input and/or output of the main amplifier 230. Similarly, input and output impedance matching networks 211, 251 (input MNp, output MNp) may be implemented at the input and/or output of the peaking amplifier 231. In each case, the matching networks 210, 211, 250, 251 may be used to incrementally increase the circuit impedance toward the load impedance and source impedance. All or portions of the input impedance matching networks 210, 211 may be implemented inside a power transistor package that includes the main and/or peaking amplifiers 230, 231, or some portions of the input impedance matching networks 210, 211 may be implemented on a PCB or other substrate to which a power transistor package is mounted.

As discussed previously in conjunction with FIG. 1, the devices (e.g., device 101) corresponding to the main and peaking amplifiers 230, 231 are "unmatched" at their outputs. Accordingly, substantially all of the output impedance matching networks 250, 251 are implemented outside the power transistor package that includes the main and/or peaking amplifiers 230, 231. In other words, the output impedance matching networks 250, 251 are implemented on the PCB plane (e.g., outside the power transistor device package on a PCB or other substrate to which the power transistor package is mounted), and not on the device plane (i.e., not within the power transistor device package).

As also discussed previously in conjunction with FIG. 1, one or more harmonic termination circuits 270, 271 (e.g., two instances of circuit 170, FIG. 1) may be coupled between the outputs of amplifiers 230, 231 and a ground reference. Essentially, each harmonic termination circuit 270, 271 effectively increases the value of the drain-source capacitance (e.g., capacitance 131, FIG. 1) of the final stage transistor associated with each amplifier 230, 231. In addition, the harmonic termination circuitry 270, 271 functions to control the second harmonic impedance across a wide fractional bandwidth at relatively low impedance. According to an embodiment, the harmonic termination circuits 270, 271 also are implemented on the PCB plane (e.g., outside the power transistor device package on a PCB or other substrate to which the power transistor package is mounted), and not on the device plane (i.e., not within the power transistor device package).

Doherty amplifier 200 has a "non-inverted" load network configuration. In the non-inverted configuration, the input circuit is configured so that an input signal supplied to the peaking amplifier 231 is delayed by 90 degrees with respect to the input signal supplied to the main amplifier 230 at the center frequency of operation, fo, of the amplifier 200. This input-side phase delay is designed to compensate for a corresponding phase delay applied along the main amplifier path 290 at the output, as is fundamental to proper Doherty amplifier operation. To ensure that the main and peaking input RF signals arrive at the main and peaking amplifiers 230, 231 with about 90 degrees of phase difference, phase delay element 282 applies about 90 degrees of phase delay to the peaking input signal. For example, phase delay element 282 may include a quarter wave transmission line, or another suitable type of delay element with an electrical length of about 90 degrees.

To ensure that the amplified signals arrive in phase at the combining node 280, the output circuit is configured to apply about a 90 degree phase delay to the signal between the output of main amplifier 230 and the combining node 280. This is achieved through an additional delay element 284, which also may provide an impedance inversion. Alternate embodiments of Doherty amplifiers may have an "inverted" load network configuration. In such a configuration, the input circuit is configured so that an input signal supplied to the main amplifier 230 is delayed by about 90 degrees with respect to the input signal supplied to the peaking amplifier 231 at the center frequency of operation, fo, of the amplifier 200, and the output circuit is configured to apply about a 90 degree phase delay to the signal between the output of peaking amplifier 231 and the combining node 280.

Amplifiers 230 and 231 may be implemented in discrete, packaged power amplifier devices (e.g., device 101, FIG. 1), as discussed previously. In such devices, input and output leads are coupled to a discrete package substrate, and each amplifier 230, 231 may include a single-stage or multi-stage power transistor also coupled to the package substrate. Portions of the input matching networks 210, 211 may be implemented as additional components within the packaged device.

For example, FIG. 3 is a top view of an embodiment of a packaged RF amplifier device 300 that embodies two parallel instances of the circuit 100 of FIG. 1, and which may be utilized to provide amplifiers (e.g., amplifiers 230, 231, FIG. 2) in a Doherty amplifier (e.g., Doherty amplifier 200, FIG. 2). The packaged RF amplifier device 300 is configured to be surface mounted to a PCB 380 or other system substrate. More specifically, the below-described package leads 302-305 are configured to be soldered or otherwise conductively attached to corresponding conductive traces 382-385 on a PCB 380 or other system substrate, and those conductive traces 382-385 are, in turn, electrically connected to other portions of the amplifier. For example, when the packaged RF amplifier device 300 is included in a Doherty power amplifier (e.g., amplifier 200, FIG. 2), trace 382 may be coupled to a first output of a signal splitter (e.g., output 208 of splitter 206, FIG. 2), trace 383 may be coupled to a second output of a signal splitter (e.g., to output 209 of splitter 206, FIG. 2), and traces 384 and 385 may be coupled to a combining node (e.g., combining node 280, FIG. 2). In addition, as discussed previously, impedance matching networks (e.g., impedance matching networks 210, 211, 250, 251, FIG. 2) and harmonic termination circuits (e.g., harmonic termination circuits 270, 271, FIG. 2) may be implemented on the PCB 380 and electrically coupled through conductive traces 382-385 to interior circuitry within device 300.

Although device 300 is depicted and described herein as being housed in a high-power device package, those of skill in the art would understand, based on the description herein, that device 300 may be housed in other types of surface-mount device packages as well, including for example, flat no-leads packages (e.g., quad flat no-leads (QFN) or dual flat no-leads (DFN) packages), in which the package leads 302-305 are instead implemented as perimeter lands that are exposed on the bottom surface of the package.

Device 300 includes a flange 306 (or "device substrate"), in an embodiment, which includes a rigid electrically-conductive substrate with a thickness that is sufficient to provide structural support for various electrical components and elements of device 300. In addition, flange 306 may function as a heat sink for transistor dies 330, 331 and other devices mounted on flange 306. Flange 306 has top and bottom surfaces (only a central portion of the top surface is visible in FIG. 3), and may have a substantially-rectangular perimeter that corresponds to the perimeter of the device 300.

Flange 306 is formed from an electrically conductive material, and may be used to provide a ground reference node for the device 300. For example, various components and elements may have terminals that are electrically coupled to flange 306, and flange 306 may be electrically coupled to a system ground when the device 300 is incorporated into a larger electrical system. For example, PCB 380 may include an embedded conductive coin below flange 306, and to which flange 306 is electrically and thermally coupled. At least the top surface of flange 306 is formed from a layer of conductive material, and possibly all of flange 306 is formed from bulk conductive material.

An isolation structure 308 is attached to the top surface of flange 306, in an embodiment. Isolation structure 308, which is formed from a rigid, electrically insulating material, provides electrical isolation between conductive features of the device (e.g., between leads 302-305 and flange 306). Isolation structure 308 has a frame shape, in an embodiment, which includes a substantially enclosed, four-sided structure with a central opening. Isolation structure 308 may have a substantially rectangular shape, as shown in FIG. 3, or isolation structure 308 may have another shape (e.g., annular ring, oval, and so on).

A portion of the top surface of flange 306 that is exposed through the opening in isolation structure 308 is referred to herein as the "active area" of device 300. Transistor dies 330, 331 are positioned within the active device area of device 300, along with IPD assemblies 318, 319, 360, 361, which will be described in more detail later. For example, the transistor dies 330, 331 and IPD assemblies 318, 319, 360, 361 may be coupled to the top surface of flange 306 using conductive epoxy, solder, solder bumps, sintering, and/or eutectic bonds.

Device 300 houses two amplification paths (indicated with arrows 390, 391), where each amplification path 390, 391 represents a physical implementation of device 101 (FIG. 1). When incorporated into a Doherty amplifier (e.g., Doherty amplifier 200, FIG. 2), amplification path 390 may correspond to a main amplifier path (e.g., main amplifier path 290, FIG. 2), and amplification path 391 may correspond to a peaking amplifier path (e.g., peaking amplifier path 291, FIG. 2).

Each path 390, 391 includes an input lead 302, 303 (e.g., input 102, FIG. 1), an output lead 304, 305 (e.g., output 104, FIG. 1), one or more transistor dies 330, 331 (e.g., transistor 130, FIG. 1), and an input impedance matching circuit 310, 311 (e.g., input impedance matching circuit 111, FIG. 1 and/or portions of input matching networks 210, 211, FIG. 2). Further, each path 390, 391 may include an input side baseband termination circuit 320, 321 (e.g., baseband termination circuit 120, FIG. 1). Further still, according to an embodiment, each path 390, 391 includes an in-package, output-side baseband termination circuit 350, 351 (e.g., baseband termination circuit 150, FIG. 1). Conspicuously, each path 390, 391 specifically excludes (or is devoid of or lacks) an in-package, output-side impedance matching network.

The input and output leads 302-305 are mounted on a top surface of the isolation structure 308 on opposed sides of the central opening, and thus the input and output leads 302-305 are elevated above the top surface of the flange 306, and are electrically isolated from the flange 306. Generally, the input and output leads 302-305 are oriented to allow for attachment of bondwires between the input and output leads 302-305 and components and elements within the central opening of isolation structure 308.

Each transistor die 330, 331 includes an integrated power FET, where each FET has a control terminal (e.g., a gate) and two current conducting terminals (e.g., a drain and a source). A control terminal of a FET within each transistor die 330, 331 is coupled through an input impedance matching circuit 310, 311 to an input lead 302, 303. In addition, one current conducting terminal (e.g., the drain) of a FET within each transistor die 330, 331 is coupled to an output lead 304, 305 through a conductive connection 334, 335. The other current conducting terminal (e.g., the source) of a FET within each transistor die 330, 331 is electrically coupled through the die 330, 331 to the flange 306 (e.g., to ground), in an embodiment.

Each input impedance matching circuit 310, 311 is coupled between an input lead 302, 303 and the control terminal of a FET within a transistor die 330, 331. In the device 300 of FIG. 3, each input impedance matching circuit 310, 311 includes two inductive elements 312, 313, 316, 317 (e.g., inductive elements 112, 116, FIG. 1) and a shunt capacitor 314, 315 (e.g., capacitor 114, FIG. 1). The shunt capacitor 314, 315 of each input impedance matching circuit 310, 311 may be included in an IPD assembly 318, 319, according to an embodiment. For example, the shunt capacitors 314, 315 may be implemented as metal-insulator-metal (MIM) capacitors within IPD assemblies 318, 319. In other embodiments, the shunt capacitor may not form a portion of an IPD assembly, but instead may be a discrete capacitor, or a capacitor that is formed in another type of assembly (e.g., an LTCC assembly). In still other alternate embodiments, each shunt capacitor may be integrated into the transistor die 330, 331.

Each inductive element 312, 313, 316, 317 is formed from a plurality of parallel, closely-spaced sets of bondwires, in an embodiment. For example, in each path 390, 391, a first inductive element 312, 313 (e.g., inductive element 112, FIG. 1) includes a plurality of bondwires coupled between an input lead 302, 303 and a first terminal of the shunt capacitor 314, 315, and a second inductive element 316, 317 (e.g., inductive element 116, FIG. 1) includes a plurality of bondwires coupled between the first terminal of the shunt capacitor 314, 315 and the control terminal of a FET within transistor die 330, 331. The second terminal of each shunt capacitor 314, 315 is electrically coupled through the IPD assembly 318, 319 to the flange 306 (e.g., to ground).

Figure 4:
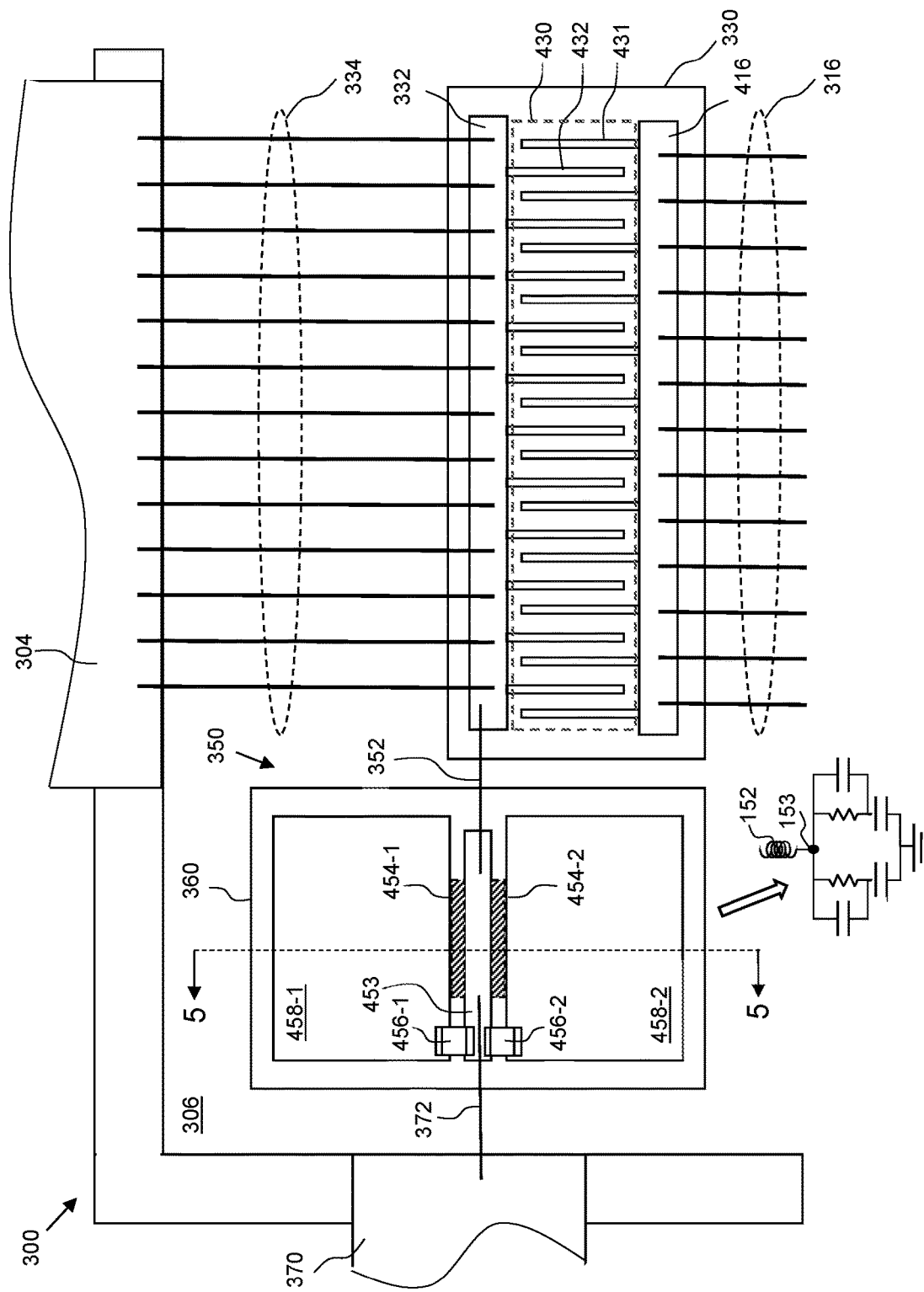
FIG. 4 is a top view of a portion of the packaged RF power amplifier device of FIG. 3, including a portion of an unmatched power transistor and an in-package baseband termination circuit, in accordance with an example embodiment.

The transistor die 330, 331 and output-side circuitry will now be described in more detail. Referring also to FIG. 4, which is an enlarged view of the portion of device 300 that is enclosed in dashed box 400 of FIG. 3, transistor die 330 includes an input terminal 416, an output terminal 332, and a FET 430 that is electrically coupled between the input and output terminals 416, 332. Each of the input and output terminals 416, 332 may be implemented in the form of an elongated bond pad, which is configured for attachment of bondwires (e.g., bondwires 316, 334).

As discussed previously, the FET 330 may include a III-V field effect transistor (e.g., a HEMT), such as a GaN FET (or another type of III-V transistor, including a GaAs FET, a GaP FET, an InP FET, or an InSb FET). More specifically, the FET 330 may be integrally formed in and on a base semiconductor substrate (e.g., a GaN substrate, a GaN-on-silicon substrate, a GaN-on-silicon carbide substrate, and so on). Conductive connections between the first current-conducting terminal of the FET 330 (e.g., the drain terminal) and the output terminal 332 of the die 330 may be made through a build-up structure (not shown) of alternating dielectric and patterned conductive layers, where portions of the patterned conductive layers are electrically connected using conductive vias. The second current-conducting terminal (e.g., the source terminal) may be electrically connected to the conductive flange 306 using through substrate vias or doped sinker regions (not shown) to a conductive layer on a bottom surface of the die 330.

According to an embodiment, the FET 430 is a "multi-finger" FET that includes multiple elongated and interdigitated doped drain and source regions arranged in parallel, where conductive terminal structures that contact the drain regions represent the aforementioned "first current conducting terminals". Elongated channel regions that are present between adjacent source and drain regions are electrically contacted by elongated control terminals 431 (e.g., gate terminals), and the elongated drain regions are electrically contacted by elongated drain terminals 432. Each of the elongated control terminals 431 is electrically connected to the input terminal 416, and each of the elongated drain terminals 432 is electrically connected to the output terminal 332. Although multi-finger FET 430 includes multiple elongated control terminals 431 and drain terminals 432, the description below refers to the control terminals 431 and the drain terminals 432 in the singular, for simplicity of description.

The input terminal 416 of the die 330 (and thus the control terminal 431 of FET 430) is connected to inductive element 316, in order to receive an input RF signal for amplification by the FET 430. At this point, it should be noted that, in FIG. 4, die 330 depicts a single-stage amplifier in which a single FET 430 provides for signal amplification. In other embodiments, die 330 may include a two-stage amplifier, which includes a pre-amplifier FET coupled in series with a final-stage FET. In such an embodiment, the input terminal 416 of the die 330 would be electrically connected to the control terminal (e.g., gate terminal) of the pre-amplifier FET, and a current-conducting terminal (e.g., drain terminal) of the pre-amplifier FET would be electrically connected to the control terminal (e.g., gate terminal) of the final-stage FET. A current-conducting terminal (e.g., drain terminal) of the final-stage FET would be electrically connected to the output terminal 332 of the die 330. In other words, a pre-amplifier FET (not shown) may be coupled between the input terminal 416 of the die 330 and the control terminal 431 of FET 430, in an alternate embodiment. Although FIG. 4 depicts a single-stage amplifier, it should be understood that FET 430 also could represent a final-stage FET in a two-stage amplifier.

In any event, according to an embodiment, a first current conducting terminal (e.g., a drain terminal 432, FIG. 4) of FET 430 is electrically connected to output lead 304 through a two-part conductive path. More specifically, the two-part conductive path includes 1) an integrated conductive path (not shown) that is connected between the first current conducting terminal 432 and the output terminal 332 (e.g., terminal 132, FIG. 1); and 2) a conductive connection 334 (e.g., connection 134, FIG. 1) that is connected between the output terminal 332 and output lead 304. The integrated conductive path has a relatively low-inductance (e.g., less than 50 pH), and includes a plurality of conductive vias and patterned portions of integrated metal layers that electrically connect the first current conducting terminal 432 of FET 430 to output terminal 332. According to an embodiment, conductive connection 334 includes a plurality of bondwires, where each bondwire has a first end connected to output terminal 332, and a second end connected to output lead 304. Conductive connection 334 also is a low-inductance component, and according to an embodiment, conductive connection 334 has an inductance in a range of about 10 pH to about 1000 pH. Accordingly, a total inductance of the conductive path between the first current conducting terminal 432 of the FET within die 330 and the output lead 304 is in a range of about 60 pH to about 1050 pH. Depending on the impedance values of the integrated conductive path and the conductive connection 334, these circuit elements may result in a minimal impedance transformation at RF frequencies, but the integrated conductive path and the conductive connection 334 are not considered to be an impedance matching circuit.

Figure 5:
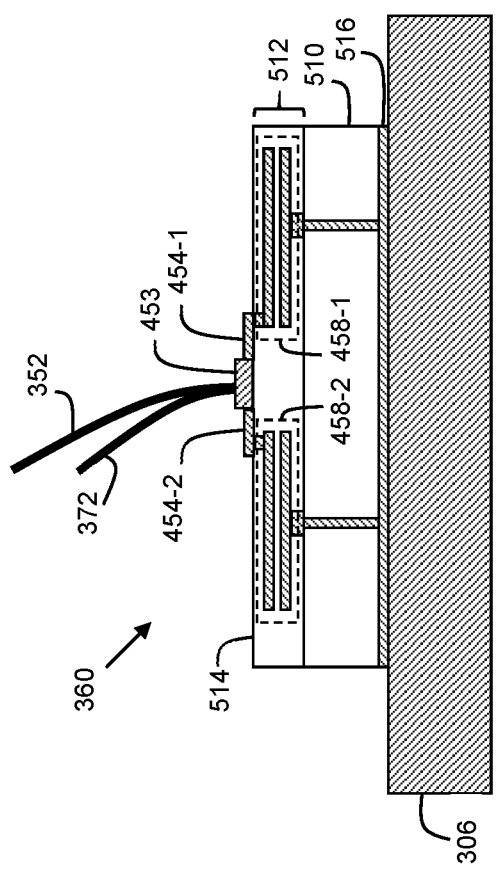
FIG. 5 is a cross-sectional, side view of the portion of the RF power amplifier device of FIG. 4 along line 5-5, in accordance with an example embodiment.

Baseband termination circuits 350, 351 (e.g., two instances of circuit 150, FIG. 1) are coupled between the output terminals 332, 333 of transistor die 330, 331 and the ground reference (e.g., flange 306). As will be described in more detail below, device 300 includes two output-side IPD assemblies 360, 361, each of which includes portions of a baseband termination circuit 350, 351 (e.g., circuit 150, FIG. 1). Baseband termination circuit 350 and output-side IPD assembly 360 are shown in detail in FIGS. 4 and 5. As mentioned above, FIG. 4 is an enlarged view of the portion of device 300 that is enclosed in dashed box 400 of FIG. 3, and accordingly FIG. 4 depicts the baseband termination circuit 350 coupled to amplification path 390. For enhanced understanding, FIG. 5 is a cross-sectional, side view of the portion 400 of device 300 in FIG. 4 along line 5-5, in accordance with an example embodiment. More specifically, FIG. 5 is a cross-sectional view through a portion of flange 306 and IPD assembly 360.

Baseband termination circuit 350 includes an envelope inductance in the form of one or more bondwires 352 (e.g., inductance 152, FIG. 1), one or more envelope resistors 454-1, 454-2 (e.g., resistor 154, FIG. 1), and one or more envelope capacitors 458-1, 458-2 (e.g., capacitor 158, FIG. 1) coupled in series between output terminal 332 of transistor die 330 and the ground reference node (e.g., flange 306). In addition, baseband termination circuit 350 may include one or more bypass capacitors 456-1, 456-2 (e.g., bypass capacitor 156, FIG. 1) connected in parallel with envelope resistor(s) 454-1, 454-2.

The bondwire(s) 352 corresponding to the envelope inductance have first end(s) connected to output terminal 332, and second end(s) connected to a bondpad 453 that is exposed at a top surface 514 of IPD 360. More generally, a first terminal of the envelope inductance is coupled to transistor output terminal 332, and a second terminal of the envelope inductance is coupled to bondpad 453 (corresponding to intermediate node 153, FIG. 1) on IPD 360. The inductance value of the envelope inductance is determined from the physical configuration (e.g., loop height, wire length) and number of bondwire(s) 352.

According to an embodiment, envelope resistors 454-1, 454-2 (collectively referred to as envelope resistor 454), envelope capacitors 458-1, 458-2 (collectively referred to as capacitor 458), and bypass capacitors 456-1, 456-2 (collectively referred to as capacitor 456) may be integrally formed with and/or connected to output-side IPD assembly 360. As shown most clearly in FIG. 5, IPD assembly 360 is coupled to the top surface of conductive flange 306, which may function as a ground reference node for the IPD assembly 360 (and for device 300). IPD assembly 360 includes a base semiconductor substrate 510 (e.g., a silicon substrate, a silicon carbide substrate, a GaN substrate, or another type of semiconductor substrate, which may be referred to as an "IPD substrate" herein) and a build-up structure 512 of alternating dielectric and patterned conductive layers, where portions of the patterned conductive layers are electrically connected using conductive vias. A conductive layer 516 on the bottom surface of the base semiconductor substrate 510 may function to mechanically and electrically connect the IPD assembly 360 to flange 306 (and thus to provide a connection to a ground reference node).

Referencing the small circuit schematic in FIG. 4 below IPD assembly 360, in the embodiments of FIGS. 4 and 5, the portion of baseband termination circuit 350 that includes envelope resistor 454, bypass capacitor 456, and envelope capacitor 458 is implemented as two parallel and symmetric (i.e., substantially identical) circuits coupled to and on opposite sides of bondpad 453. In an alternate embodiment, the portion of baseband termination circuit 350 that includes resistor 454, bypass capacitor 456, and envelope capacitor 458 may be implemented as a single circuit with only a single instance of each of resistor 454, bypass capacitor 456, and envelope capacitor 458.

Either way, envelope resistor 454 and envelope capacitor 458 are connected in series between bondpad 453 and the ground reference node (e.g., flange 306), and bypass capacitor 456 is connected in parallel with envelope resistor 454. Envelope resistor 454 may be implemented as one or more integrated resistors or as one or more discrete resistors, in various embodiments. For example, in the embodiment illustrated in FIGS. 4 and 5, envelope resistor 454 includes two resistors (e.g., resistors 454-1, 454-2, FIG. 4) that are integrally formed as portion(s) of IPD assembly 360. For example, each envelope resistor 454-1, 454-2 may be a polysilicon resistor formed from a layer of polysilicon on or within build-up structure 512, and electrically coupled between bondpad 453 and envelope capacitor 458. In other alternate embodiments, the envelope resistor 454 may be formed from tungsten silicide or another material, may be a thick or thin film resistor, or may be a discrete component coupled to a top surface 514 of IPD assembly 460. The total resistance value of envelope resistor 454 is the effective resistance of resistors 454-1 and 454-2.

According to an embodiment, a bypass capacitor 456-1, 456-2 is coupled in parallel with each envelope resistor 454-1, 454-2. Each of the bypass capacitors 456-1, 456-2 may be, for example, a discrete capacitor that is connected (e.g., using solder, a conductive epoxy, or other means) to a top surface 514 of IPD assembly 360. More specifically, a first terminal of each bypass capacitor 456-1, 456-2 may be electrically coupled to bondpad 453 (and thus to a first terminal of envelope resistors 454-1, 454-2), and a second terminal of each bypass capacitor 456-1, 456-2 may be connected to a first terminal of an envelope capacitor 458-1, 458-2 (and thus to a second terminal of an envelope resistor 454-1, 454-2).

For example, each bypass capacitor 456-1, 456-2 may be a multiple-layer capacitor (e.g., a multiple-layer ceramic capacitor) with parallel, interleaved electrodes and wraparound end terminations. Alternatively, each bypass capacitor 456-1, 456-2 may form a portion of a separate IPD (e.g., a MIM capacitor formed on a semiconductor substrate), or may be a capacitor that is integrally formed with the semiconductor substrate of the IPD assembly 360. Alternatively, each bypass capacitor 456-1, 456-2 may be implemented as some other type of capacitor capable of providing the desired capacitance for the baseband termination circuit 350. The total capacitance value of bypass capacitor 456 is the effective capacitance of capacitors 456-1 and 456-2.

Envelope capacitor 458 may be implemented as one or more integrated capacitors or as one or more discrete capacitors, in various embodiments. For example, in the embodiment illustrated in FIGS. 4 and 5, envelope capacitor 458 includes two capacitors (e.g., capacitors 458-1, 458-2, FIG. 4) that are integrally formed as portion(s) of IPD assembly 360. The envelope capacitor 458 is electrically coupled between a ground reference node (e.g., flange 306 and/or the conductive layer 516 at the bottom surface of each IPD assembly 360) and the parallel combination of envelope resistor 454 and bypass capacitor 456. The total capacitance value of envelope capacitor 458 is the effective capacitance of capacitors 458-1 and 458-2.

Each of envelope capacitors 458-1, 458-2 may be a MIM capacitor that is integrally formed with IPD assembly 360, for example. In some embodiments, capacitors 458-1, 458-2 may be formed in the build-up structure 512 entirely above the semiconductor substrate 510, or capacitors 458-1, 458-2 may have portions that extend into the semiconductor substrate 510 or are otherwise coupled to, or in contact with, the semiconductor substrate 510. According to an embodiment, the capacitors 458-1, 458-2 may be formed from a first electrode, a second electrode, and a dielectric material between the first and second electrodes. The dielectric material of capacitors 458-1, 458-2 may include one or more layers of polysilicon, various oxides, a nitride, or other suitable materials. In various embodiments, the first and second electrodes of capacitors 458-1, 458-2 may include horizontal portions of conductive layers (e.g., portions that are parallel to the top and bottom surfaces of IPD assembly 360) and/or vertical portions (e.g., portions that are parallel to the sides of IPD assembly 360) of conductive layers that are interconnected. Further, the first and second electrodes of capacitors 458-1, 458-2 may be formed from metal layers and/or from conductive semiconductor materials (e.g., polysilicon). Alternatively, each envelope capacitors 458-1, 458-2 may be, for example, a discrete capacitor that is connected (e.g., using solder, a conductive epoxy, or other means) to a top surface 514 of the IPD assembly 360. Although particular two-plate capacitor structures are shown in FIG. 5 for capacitors 458-1, 458-2, a variety of other capacitor structures alternatively may be utilized, as would be understood by one of skill in the art based on the description herein.

Referring again to FIG. 3, in addition to the input and output leads 302-305, device 300 also may include input-side bias leads (not numbered) and output-side bias leads 370, 371. The input-side bias leads may be electrically coupled through bondwires (not shown) and other conductors to the control terminal of the FET within each transistor die 330, 331. Conversely, the output-side bias lead 370 is electrically coupled through bondwires 372 and 352 to the first current conducting terminal (e.g., the drain terminal) of the final-stage FET within transistor die 330, and the output-side bias lead 371 is electrically coupled through bondwires 373 and 353 to the first current conducting terminal (e.g., the drain terminal) of the final-stage FET within transistor die 331. Accordingly, as clearly shown in FIG. 4, bondpad 453 serves as an intermediate node to convey the drain bias voltage to output terminal 332, and ultimately to the drain terminal of transistor 430. In an alternate embodiment, a single bondwire (e.g., a bondwire that "hops over" IPD 360) may be used to convey the bias voltage from bias lead 370 to output terminal 332.

The bias leads 370, 371 may be electrically coupled through traces on substrate 380 to external bias circuit(s) (not shown), which provide drain bias voltages to the current conducting terminal (e.g., drain terminal) of each FET through the bias leads 370, 371. In other embodiments, the output-side bias leads 370, 371 and bondwires 372, 373 may be excluded, and the drain bias voltages may be provided instead through leads 304, 305 and connectors 334, 335.

In the example of FIG. 3, device 300 includes two transistor dies 330, 331 that essentially function in parallel, although another semiconductor device may include a single transistor die or more than two parallel-coupled transistor dies, as well. In addition, device 300 includes two input-side IPD assemblies 318, 319 and two output-side IPD assemblies 360, 361, which also essentially function in parallel. It is to be understood that more or fewer of IPD assemblies 318, 319, 360, 361 may be implemented, as well.

According to an embodiment, device 300 is incorporated in an air cavity package, in which transistor dies 330, 331, the IPD assemblies 318, 319, 360, 361, and various other components are located within an enclosed air cavity. Basically, the air cavity is bounded by flange 306, isolation structure 308, and a cap (not shown) overlying and in contact with the isolation structure 308 and leads 302-305. In other embodiments, the components of device 300 may be incorporated into an overmolded package (i.e., a package in which the electrical components within the active device area are encapsulated with a non-conductive molding compound, and in which portions of the leads 302-305 also may be encompassed by the molding compound). In an overmolded package, isolation structure 308 may be excluded. In still other embodiments, as discussed previously, transistor dies 330, 331, the IPD assemblies 318, 319, 360, 361, and various other components may be housed in a different type of package altogether, such as a QFN, DFN, or other type of surface mount package. In such other embodiments, leads 302-305 may be replaced perimeter lands that are exposed on the bottom surface of the package, but are electrically isolated from the flange 306.

FIG. 6 is a flowchart of a method for fabricating a packaged RF power amplifier device (e.g., device 300, FIG. 3), in accordance with various example embodiments. The method may begin, in block 602, by forming one or more input and output IPD assemblies (e.g., IPD 318, 319, 360, 361, FIGS. 3-5) may be formed. According to an embodiment, each output IPD assembly (e.g., IPD assemblies 360, 361) includes components of baseband termination circuit. For example, each output IPD assembly may include one or more integrated envelope resistors (e.g., resistor 454, FIG. 4), and integrated envelope capacitors (e.g., capacitor 458, FIG. 4). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bond pads (e.g., bondpad 453, FIG. 4, corresponding to node 153, FIG. 1), which may accept attachment of inductive elements (e.g., bondwires 352, 352, 372, 373, FIGS. 3-5). In addition, discrete components corresponding to various circuit elements (e.g., bypass capacitor 456, FIG. 4) may be coupled to conductors exposed at the surface of each IPD to form one or more IPD assemblies.

In block 604, for an air cavity embodiment, an isolation structure (e.g., isolation structure 308, FIG. 3) is coupled to a device substrate (e.g., flange 306). In addition, one or more active devices (e.g., transistors 330, 331) and IPD assemblies (e.g., IPD assemblies 318, 319, 360, 361) are coupled to a portion of the top surface of the substrate that is exposed through an opening in the isolation structure. Leads (e.g., input and output leads 302-305, and bias leads 370, 371) are coupled to the top surface of the isolation structure. For overmolded (e.g., encapsulated) and flat, no-leads device embodiments, the isolation structure may be excluded, and the substrate and leads (or lands) may form portions of a leadframe or a flat no-leads device substrate.

In block 606, the input lead(s), transistor(s), IPD assembly(ies), bias lead(s), and output lead(s) are electrically coupled together. For example, the electrical connections may be made using bondwires between the various device components and elements, as discussed previously. Some of the bondwires correspond to inductive components of input matching circuits (e.g., bondwires 312, 316, FIG. 3), output connectors (e.g., bondwires 334, FIG. 3), and baseband termination circuits (e.g., bondwires 352, 353, FIGS. 3-5), for example. Finally, in block 608, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of a packaged RF amplifier device includes a device substrate, an input lead coupled to the device substrate, an output lead coupled to the device substrate, and a transistor die coupled to the device substrate. The transistor die includes a transistor, a transistor input terminal coupled to the input lead, and a transistor output terminal coupled to the output lead, and the transistor has a drain-source capacitance below 0.1 picofarads per watt. The device also includes a conductive connection coupled between the transistor output terminal and the output lead, and a baseband termination circuit coupled between the transistor output terminal and a ground reference node. The baseband termination circuit is configured to present a low impedance to signal energy at envelope frequencies and a high impedance to signal energy at RF frequencies. The baseband termination circuit includes an inductive element, a resistor, and a capacitor connected in series between the transistor output terminal and the ground reference node. Except for a minimal impedance transformation associated with the conductive connection, the packaged RF amplifier device is unmatched between the transistor output terminal and the output lead by being devoid of impedance matching circuitry between the transistor output terminal and the output lead.

An embodiment of an RF amplifier includes a system substrate with a first input trace and a first output trace, and a first amplification path that includes a packaged RF amplifier device coupled to the system substrate. The packaged RF amplifier device includes a device substrate, an input lead coupled to the device substrate and to the first input trace of the system substrate, an output lead coupled to the device substrate and to the first output trace of the system substrate, and a transistor die coupled to the device substrate. The transistor die includes a transistor, a transistor input terminal coupled to the input lead, and a transistor output terminal coupled to the output lead, and the transistor has a drain-source capacitance below 0.1 picofarads per watt. The packaged RF amplifier device also includes a conductive connection coupled between the transistor output terminal and the output lead, and a baseband termination circuit coupled between the transistor output terminal and a ground reference node. The baseband termination circuit is configured to present a low impedance to signal energy at envelope frequencies and a high impedance to signal energy at RF frequencies. The baseband termination circuit includes an inductive element, a resistor, and a capacitor connected in series between the transistor output terminal and the ground reference node. Except for a minimal impedance transformation associated with the conductive connection, the packaged RF amplifier device is unmatched between the transistor output terminal and the output lead by being devoid of impedance matching circuitry between the transistor output terminal and the output lead.

An embodiment of a method of manufacturing a packaged RF amplifier device includes coupling a input lead and a output lead to a device substrate, and coupling a transistor die to the device substrate between the input lead and the output lead. The transistor die includes a transistor and a transistor output terminal, and the transistor has a drain-source capacitance below 0.1 picofarads per watt. The method also includes coupling a conductive connection between the transistor output terminal and the output lead, and coupling a baseband termination circuit to the device substrate between the transistor output terminal and a ground reference node. The baseband termination circuit is configured to present a low impedance to signal energy at envelope frequencies and a high impedance to signal energy at RF frequencies. The baseband termination circuit includes an inductive element, a resistor, and a capacitor connected in series between the transistor output terminal and the ground reference node. Except for a minimal impedance transformation associated with the conductive connection, the packaged RF amplifier device is unmatched between the transistor output terminal and the output lead by being devoid of impedance matching circuitry between the transistor output terminal and the output lead.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
   a device substrate;
   an input lead coupled to the device substrate;
   an output lead coupled to the device substrate;
   a transistor die coupled to the device substrate, wherein the transistor die includes a transistor, a transistor input terminal coupled to the input lead, and a transistor output terminal coupled to the output lead, and wherein the transistor has a drain-source capacitance below 0.1 picofarads per watt;
   a conductive connection coupled between the transistor output terminal and the output lead; and a first baseband termination circuit coupled between the transistor output terminal and a ground reference node, wherein the first baseband termination circuit is configured to present a low impedance to signal energy at envelope frequencies and a high impedance to signal energy at RF frequencies, and wherein the first baseband termination circuit includes an inductive element, a resistor, and a capacitor connected in series between the transistor output terminal and the ground reference node, and wherein, except for a minimal impedance transformation associated with the conductive connection, the packaged RF amplifier device is unmatched between the transistor output terminal and the output lead by being devoid of impedance matching circuitry between the transistor output terminal and the output lead.

2. The packaged RF amplifier device of claim 1, further comprising:

an integrated passive device coupled to the device substrate, wherein the resistor and the capacitor are integrally formed with the integrated passive device, and wherein the inductive element comprises one or more bondwires connected between the transistor output terminal and the integrated passive device.

3. The packaged RF amplifier device of claim 2, wherein the capacitor includes one or more metal-insulator-metal capacitors.

4. The packaged RF amplifier device of claim 1, wherein the transistor is a gallium nitride transistor.

5. The packaged RF amplifier device of claim 1, wherein:
the inductive element has an inductance value in a range of 500 picohenries to 2.0 nanohenries;
the resistor has a resistance value in a range of 0.1 ohm to 5.0 ohm; and
the capacitor has a capacitance value in a range of 1 nanofarad to 1 microfarad.

6. The packaged RF amplifier device of claim 1, wherein the first baseband termination circuit further includes a bypass capacitor coupled in parallel with the resistor.

7. The packaged RF amplifier device of claim 1, wherein the conductive connection comprises a set of bondwires coupled between the transistor output terminal and the output lead, and wherein the set of bondwires has an inductance value less than 500 picohenries.

8. The packaged RF amplifier device of claim 1, further comprising:
a bias lead that is electrically connected to the transistor output terminal through the inductive element.

9. The packaged RF amplifier device of claim 1, further comprising:
an input impedance matching circuit coupled between the input lead and the transistor input terminal.

10. The packaged RF amplifier device of claim 9, further comprising:
a second baseband termination circuit coupled between the transistor input terminal and the ground reference node.

11. The packaged RF amplifier device of claim 1, wherein the packaged RF amplifier device is configured to be surface mounted to a printed circuit board.

12. A radio frequency (RF) amplifier comprising:
a system substrate with a first input trace and a first output trace; and
a first amplification path that includes a packaged RF amplifier device coupled to the system substrate, wherein the packaged RF amplifier device includes
a device substrate,
an input lead coupled to the device substrate and to the first input trace of the system substrate,
an output lead coupled to the device substrate and to the first output trace of the system substrate,
a transistor die coupled to the device substrate, wherein the transistor die includes a transistor, a transistor input terminal coupled to the input lead, and a transistor output terminal coupled to the output lead, and wherein the transistor has a drain-source capacitance below 0.1 picofarads per watt,
a conductive connection coupled between the transistor output terminal and the output lead, and
a baseband termination circuit coupled between the transistor output terminal and a ground reference node, wherein the baseband termination circuit is configured to present a low impedance to signal energy at envelope frequencies and a high impedance to signal energy at RF frequencies, and wherein the baseband termination circuit includes an inductive element, a resistor, and a capacitor connected in series between the transistor output terminal and the ground reference node, and
wherein, except for a minimal impedance transformation associated with the conductive connection, the packaged RF amplifier device is unmatched between the transistor output terminal and the output lead by being devoid of impedance matching circuitry between the transistor output terminal and the output lead.

13. The RF amplifier of claim 12, further comprising:
an integrated passive device coupled to the device substrate, wherein the resistor and the capacitor are integrally formed with the integrated passive device, and wherein the inductive element comprises one or more bondwires connected between the transistor output terminal and the integrated passive device.

14. The RF amplifier of claim 12, wherein the transistor is a gallium nitride transistor.

15. The RF amplifier of claim 12, wherein the conductive connection comprises a set of bondwires coupled between the transistor output terminal and the output lead, and wherein the set of bondwires has an inductance value less than 500 picohenries.

16. The RF amplifier of claim 12, wherein the RF amplifier is a Doherty power amplifier, the first amplification path is a main amplification path, and the RF amplifier further comprises:
a peaking amplification path;
a power divider with a divider input configured to receive an RF signal, a first divider output coupled to an input of the main amplification path, and a second divider output coupled to an input of the peaking amplification path, wherein the power divider is configured to divide the RF signal into a first RF signal that is provided to the main amplification path through the first divider output, and into a second RF signal that is provided to the peaking amplification path through the second divider output; and
a combining node configured to receive and combine amplified RF signals produced by the main and peaking amplification paths.

17. A method of manufacturing a packaged radio frequency (RF) amplifier device, the method comprising the steps of:
coupling a first input lead to a device substrate;
coupling a first output lead to the device substrate;

coupling a first transistor die to the device substrate between the first input lead and the first output lead, wherein the first transistor die includes a first transistor and a first transistor output terminal, and wherein the first transistor has a drain-source capacitance below 0.1 picofarads per watt;

coupling a first conductive connection between the first transistor output terminal and the first output lead; and coupling a first baseband termination circuit to the device substrate between the first transistor output terminal and a ground reference node, wherein the first baseband termination circuit is configured to present a low impedance to signal energy at envelope frequencies and a high impedance to signal energy at RF frequencies, and wherein the first baseband termination circuit includes an inductive element, a resistor, and a capacitor connected in series between the first transistor output terminal and the ground reference node, and wherein, except for a minimal impedance transformation associated with the first conductive connection, the packaged RF amplifier device is unmatched between the first transistor output terminal and the first output lead by being devoid of impedance matching circuitry between the first transistor output terminal and the first output lead.

18. The method of claim 17, wherein coupling the first baseband termination circuit to the device substrate comprises:

coupling an integrated passive device to the device substrate, wherein the integrated passive device includes the resistor and the capacitor; and connecting one or more bondwires that comprise the inductive element between the first transistor output terminal and the integrated passive device.

19. The method of claim 18, further comprising:
coupling a bias lead to the device substrate; and
connecting one or more bondwires between the bias lead and the integrated passive device.

20. The method of claim 17, further comprising:
coupling a second input lead to the device substrate;
coupling a second output lead to the device substrate;
coupling a second transistor die to the device substrate between the second input lead and the second output lead, wherein the second transistor die includes a second transistor and a second transistor output terminal, and wherein the second transistor has a drain-source capacitance below 0.1 picofarads per watt;

coupling a second conductive connection between the second transistor output terminal and the second output lead; and coupling a second baseband termination circuit to the device substrate between the second transistor output terminal and the ground reference node, wherein the second baseband termination circuit is configured to present a low impedance to signal energy at envelope frequencies and a high impedance to signal energy at RF frequencies, and wherein, except for a minimal impedance transformation associated with the second conductive connection, the packaged RF amplifier device is unmatched between the second transistor output terminal and the second output lead by being devoid of impedance matching circuitry between the second transistor output terminal and the second output lead.

\* \* \* \* \*